(12) United States Patent
Abhishek et al.

(10) Patent No.: US 9,645,195 B2
(45) Date of Patent: May 9, 2017

(54) SYSTEM FOR TESTING INTEGRATED CIRCUIT

(71) Applicants: Kumar Abhishek, Indirapuram (IN);
Kushal Kamal, New Delhi (IN);
Vandana Sapra, Delhi (IN)

(72) Inventors: Kumar Abhishek, Indirapuram (IN);
Kushal Kamal, New Delhi (IN);
Vandana Sapra, Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 595 days.

(21) Appl. No.: 14/288,358

(22) Filed: May 27, 2014

(65) Prior Publication Data
US 2015/0346272 A1    Dec. 3, 2015

(51) Int. Cl.
| H03M 1/12 | (2006.01) |
| G01R 31/28 | (2006.01) |
| H03M 1/40 | (2006.01) |
| H03M 1/42 | (2006.01) |
| H03M 1/46 | (2006.01) |
| H03M 1/38 | (2006.01) |

(52) U.S. Cl.
CPC ...... *G01R 31/2856* (2013.01); *H03M 1/1245* (2013.01); *H03M 1/38* (2013.01); *H03M 1/40* (2013.01); *H03M 1/42* (2013.01); *H03M 1/466* (2013.01)

(58) Field of Classification Search
CPC .......... H03M 1/466; H03M 1/40; H03M 1/38; H03M 1/42; H03M 1/1245; G01R 31/2856

USPC .................................................. 341/155, 118
See application file for complete search history.

(56) References Cited

U.S. PATENT DOCUMENTS

| 7,242,330 | B2 | 7/2007 | Alter |
| 7,279,960 | B1 | 10/2007 | Lee |
| 7,541,952 | B1 | 6/2009 | Sankaran et al. |
| 7,880,649 | B2 * | 2/2011 | Asami ................. H03M 1/0614 341/117 |
| 7,944,379 | B2 | 5/2011 | Ohnhaeuser et al. |
| 8,289,094 | B2 | 10/2012 | Wennekers et al. |
| 8,319,509 | B1 * | 11/2012 | Staver ................. H03M 1/1071 324/750.01 |
| 8,451,159 | B1 | 5/2013 | Gupta et al. |
| 9,000,788 | B2 * | 4/2015 | Pagani ............. G01R 31/31713 324/750.3 |
| 9,106,247 | B2 * | 8/2015 | Hamilton ............... H03M 1/109 |
| 2013/0207824 | A1 | 8/2013 | Waters |

\* cited by examiner

*Primary Examiner* — Brian Young
(74) *Attorney, Agent, or Firm* — Charles E. Bergere

(57) ABSTRACT

An integrated circuit (IC) is connected to an automated test equipment (ATE) with pogo pins. The IC includes an analog-to-digital converter (ADC), a voltage controlled oscillator (VCO), and a compensation circuit. The ATE provides reference voltage signals to the ADC by way of the pogo pins. A potential drop across a pogo pin introduces an error in a reference voltage signal that is reflected in a digital signal generated by the ADC. The VCO generates reference frequency signals corresponding to the reference voltage signals. The compensation circuit receives the reference frequency signals and the digital signal and generates a compensation factor signal. The compensation circuit multiplies the compensation factor signal and the digital signal to generate a compensated digital signal to compensate for the error introduced by the potential drop across the pogo pins.

18 Claims, 5 Drawing Sheets

SYSTEM FOR TESTING INTEGRATED CIRCUIT

BACKGROUND OF THE INVENTION

The present invention relates generally to electronic circuits, and, more particularly, to a system for testing an integrated circuit.

Integrated circuits (ICs) today can include up to a billion electronic components on a single chip. With such complex circuitry, a lot of testing must be performed to insure the circuit will operate as proposed. For example, functional simulation is performed on the circuit design before the circuit is fabricated, and on the circuit itself after fabrication. After fabrication, the circuit or chip must also be tested for manufacturing defects. Manufacturing test is performed using automated test equipment (ATE) and an IC being testing is referred to as a device under test (DUT). The ATE includes a processor, a digital signal processor (DSP), a probe head, and a probe card. The processor executes a test program corresponding to the manufacturing test. The DSP is used to conduct analog testing of the DUT. The probe head connects the ATE to the DUT. Generally, a pogo pin is used as the probe head. The pogo pin connects the ATE to contact test points and component leads of the DUT. The probe card is an electrical interface, such as a printed circuit board (PCB) on which the DUT is mounted. The ATE includes multiple pogo pins in the form of a bed of pogo pins. Multiple ICs are connected to the ATE using the bed for simultaneous manufacturing testing.

The pogo pin is rated for testing up to a million DUTs before being replaced and is generally made of gold. The pogo pin is highly conductive and conducts a large current, which causes it to become resistive over time. The resistance of the pogo pin results in development of a potential drop across the pogo pin that can result in erroneous feedback from the manufacturing tests performed on the DUT, leading to an increase in yield loss, i.e., some good chips may be rejected. One solution to reduce this yield loss is to replace the pogo pins after a few thousand DUTs are tested. However, replacement of the pogo pins is a manual and time-consuming process that results in increased manufacturing test time and consequently in increased manufacturing cost.

During the manufacturing test, all circuits of the DUT are tested. The chip is scribed as good if all of the internal circuits pass the manufacturing test; while the chip is scribed as bad if even a single internal circuit fails.

When testing an Analog-to-Digital Converter (ADC), the ADC receives an analog voltage signal ($V_{in}$) in a defined range and generates a digital signal. The ADC also receives high and low reference voltage signals, $V_{refh}$ and $V_{refl}$ respectively, which determine the range of analog voltage signals ($V_{in}$) that the ADC can convert to digital signals. For example, a 2-bit ADC has $V_{refh}$=4 volts (V) and $V_{refl}$=0V. The 2-bit ADC can convert the analog voltage signals ($V_{in}$) ranging from 0V to 4V. This range of voltages is divided into steps and a size of each step is determined by the following formula:

$$\text{Step Size} = (V_{refh} - V_{refl})/2^N,$$

where N represents number of bits in the digital signal.
In this example, the step size of the ADC is 1V, which corresponds to one least significant bit (LSB). Thus, the reference voltage signals determine the digital signal output by the ADC. An anomaly in the reference voltage signal adversely affects the digital signal.

The ADC has two reference pins for the high and low reference voltage signals. Usually these reference pins are connected to a supply pin of the ADC. The pogo pins of the ATE are connected to the reference pins of the ADC to perform the manufacturing test on the ADC. The reference pins of the ADC draw less current from the ATE than the supply pin. When the supply and reference pins are connected to each other, a large current flows by way of the reference pins, resulting in an anomaly of the potential at the reference pins. Thus, for a 2-bit ADC, the high reference voltage signal ($V_{refh}$) goes down from 4V to 3.5V, while the low reference voltage signal ($V_{refl}$) increases from 0V to 0.5V. This changes the step size from 1V to 0.75V, which is undesirable. A total unadjusted error (TUE) of the ADC represents a difference between an ideal digital signal and the actual digital signal output by the ADC. In this example, the TUE calculated by the ATE is high and results in the ADC failing the manufacturing test. Thus, the ADC fails the manufacturing test due to an error in the pogo pin and not because of an actual manufacturing defect. Such a scenario leads to increased yield loss, which in turn results in increased manufacturing costs.

To overcome the above-mentioned problem, the reference voltage signals received by the reference pins of the ADC by way of the pogo pins are exposed to an alternate pair of pins of the ADC. The reference voltage signals are measured from the alternate reference pins by way of an analog circuit. A software calibration method implemented by the ATE adjusts the measured reference voltage signals such that the ADC passes the manufacturing test. However, this solution involves the use of an additional pair of pins, an additional analog circuit, and a software calibration code. The addition of two extra pins on each ADC, and hence on each DUT, limits the total number of DUTs that can be tested in parallel by the ATE. Moreover, the additional analog circuit results in area overhead of the DUT.

Therefore, it would be advantageous to be able to accurately test an IC and avoid unnecessary yield loss.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
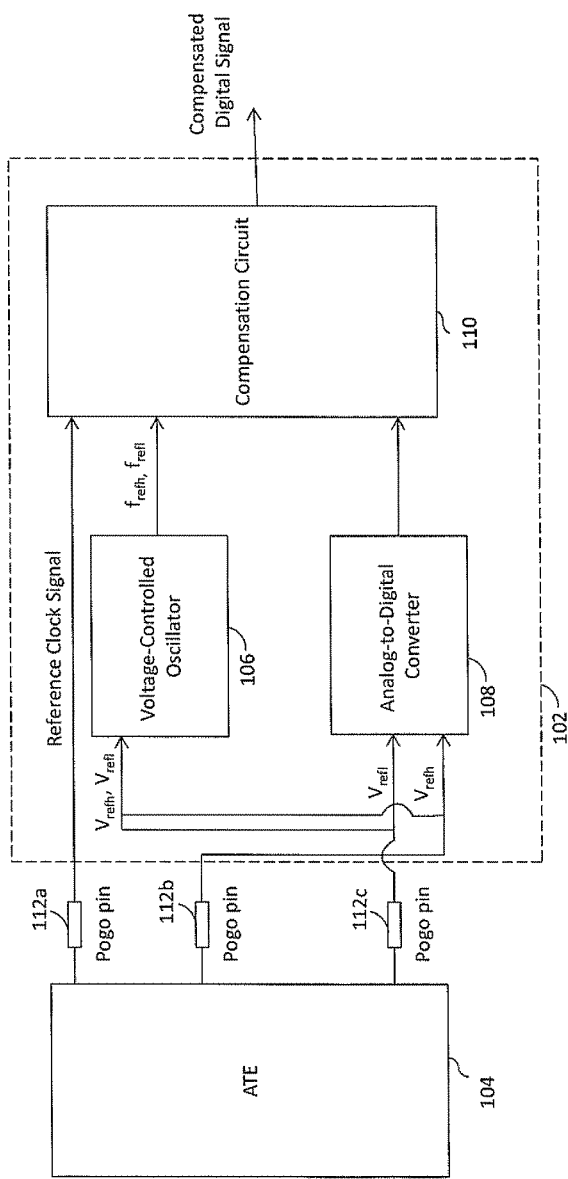
FIG. 1 is a schematic block diagram of an integrated circuit (IC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit that is connected to an automated test equipment (ATE) by way of at least one pogo pin for testing the integrated circuit is provided. The integrated circuit includes a voltage controlled oscillator (VCO), an analog-to-digital converter (ADC), and a compensation circuit. The VCO has an input terminal connected to the at least one pogo pin for receiving first, second, third, and fourth reference voltage signals during first, second, third, and fourth time intervals, respectively, and an output terminal for outputting first, second, third, and fourth reference frequency signals corresponding to the first, second, third, and fourth reference voltage signals during the first, second, third, and fourth time intervals, respectively. The ADC has a first input terminal for receiving an analog signal, a second input terminal connected to the at least one pogo pin for receiving the third reference voltage signal during the third time interval, a third input terminal connected to the at least one pogo pin for receiving the fourth reference voltage signal during the fourth time interval, and an output terminal for outputting a digital signal based on the analog signal and the third and fourth reference voltage signals. The compensation circuit is connected to the output terminals of the VCO and the ADC for generating a compensated digital signal based on the digital signal and the first, second, third, and fourth reference frequency signals.

In another embodiment of the present invention, an integrated circuit is connected to an automated test equipment (ATE) by way of at least one pogo pin for testing the integrated circuit. The integrated circuit includes a voltage controlled oscillator (VCO), an analog-to-digital converter (ADC), and a compensation circuit. The VCO has an input terminal connected to the at least one pogo pin for receiving first, second, third, and fourth reference voltage signals during first, second, third, and fourth time intervals, respectively, and an output terminal for outputting first, second, third, and fourth reference frequency signals corresponding to the first, second, third, and fourth reference voltage signals during the first, second, third, and fourth time intervals, respectively. The ADC has a first input terminal for receiving an analog signal, a second input terminal connected to the at least one pogo pin for receiving the third reference voltage signal during the third time interval, a third input terminal connected to the at least one pogo pin for receiving the fourth reference voltage signal during the fourth time interval, and an output terminal for outputting a digital signal based on the analog signal and the third and fourth reference voltage signals. The compensation circuit is connected to the output terminals of the VCO and the ADC for generating a compensated digital signal based on the digital signal and the first, second, third, and fourth reference frequency signals. The compensation circuit includes a compensation factor calculation circuit and a multiplier circuit. The compensation factor calculation circuit receives the first, second, third, and fourth reference frequency signals during the first, second, third, and fourth time intervals, respectively, and generates a compensation factor signal based on the first, second, third, and fourth reference frequency signals. The multiplier circuit is connected to the compensation factor calculation circuit for receiving the compensation factor signal and to the output terminal of the ADC for receiving the digital signal and generating a compensated digital signal based on the compensation factor and the digital signals.

In yet another embodiment of the present invention, a method of compensating a digital signal output by an analog-to-digital converter (ADC) of an integrated circuit that is connected to an automated test equipment (ATE), is provided. The integrated circuit is connected to the ATE by way of at least one pogo pin. A voltage drop across the at least one pogo pin causes an error in the digital signal. The integrated circuit includes a voltage controlled oscillator (VCO), the ADC, and a compensation circuit. The VCO generates first, second, third, and fourth reference frequency signals corresponding to first, second, third, and fourth reference voltage signals, during first, second, third, and fourth time intervals, respectively. The ADC generates a digital signal based on an analog signal, and the third and fourth reference voltage signals. The compensation circuit generates a compensated digital signal based on the digital signal and the first, second, third, and fourth reference frequency signals.

Various embodiments of the present invention provide an integrated circuit (IC) that is connected to an automated test equipment (ATE) by way of at least one pogo pin for the IC. The IC includes a voltage controlled oscillator (VCO), an ADC, and a compensation circuit. The VCO generates first, second, third, and fourth reference frequency signals corresponding to first, second, third, and fourth reference voltage signals received from the ADC. The ADC receives an analog voltage signal and generates a digital signal. The compensation circuit generates a compensated digital signal based on the first, second, third, and fourth reference frequency signals, and the digital signal. Thus, the IC of the present invention compensates for an error introduced by a voltage drop across the at least one pogo pin by way of the compensation circuit. As a result, the IC manufacturing-test does not lead to an increased yield loss. The problem of area overhead is overcome due to the absence of additional analog circuitry for measuring reference voltage signals. In addition, the manufacturing-test time is reduced as no additional software calibration code is executed in the ATE.

Referring now to FIG. 1, a schematic block diagram of an integrated circuit (IC) 102 that is connected to an automated test equipment (ATE) 104, in accordance with an embodiment of the present invention, is shown. The IC 102 includes a voltage controlled oscillator (VCO) 106, an analog-to-digital converter (ADC) 108, and a compensation circuit 110. The ATE 104 is connected to the IC 102 by way of first through third pogo pins 112a-112c. The ATE 104 performs various manufacturing-tests to identify manufacturing defects, such as parametric faults and random defects in the IC 102. These manufacturing-tests are specific to each electronic circuit of the IC 102, including the ADC 108.

The ADC 108 is an N-bit ADC and has a first input terminal that receives an analog voltage signal ($V_{in}$) (not shown) and an output terminal that outputs a digital signal. The ADC 108 has second and third input terminals that are connected to the ATE 104 by way of the second and third pogo pins 112b and 112c to receive reference voltage signals therefrom. The second input terminal receives a high reference voltage signal ($V_{refh}$) and the third input terminal receives a low reference voltage signal ($V_{refl}$). The ADC 108 generates the digital signal based on the analog voltage signal ($V_{in}$), and the high and low reference voltage signals ($V_{refh}$ and $V_{refl}$). The digital signal is represented by the following formula:

$$\text{Digital signal} = (V_{in} * 2^N)/(V_{refh} - V_{refl}),$$

where N represents number of bits in the digital signal.

The VCO 106 has an input terminal connected to the second and third pogo pins 112b and 112c to receive the high and low reference voltage signals ($V_{refh}$ and $V_{refl}$) therefrom. The VCO 106 outputs high and low reference frequency signals ($f_{refh}$ and $f_{refl}$) that correspond to the high and low reference voltage signals ($V_{refh}$ and $V_{refl}$) at an output terminal thereof. The output terminals of the VCO 106 and the ADC 108 are connected to the compensation circuit 110. The ATE 104 provides a reference clock signal to the compensation circuit 110 by way of the first pogo pin 112a. The compensation circuit 110 generates a compensated digital signal based on the digital signal, the high and low reference frequency signals ($f_{refh}$ and $f_{refl}$), and the reference clock signal.

A manufacturing-test performed on the ADC 108 is scheduled for a definite time period. In operation, a gain of the VCO 106 is measured and stored in the ATE 104. The manufacturing-test corresponds to three phases of operation. During first phase of operation, the ADC 108 is disabled, implying that the ADC 108 does not perform an analog-to-digital conversion. The second and third terminals of the ADC 108 receive the high and low reference voltage signals ($V_{refh}$ and $V_{refl}$), respectively. As the ADC 108 is disabled, no current flows by way of the second and third pogo pins 112b and 112c to the second and third terminals of the ADC 108, respectively. Due to the absence of current in the resistive second and third pogo pins 112b and 112c, a potential drop across the second and third pogo pins 112b and 112c is absent. The ADC 108, thus, receives ideal values of the high and low reference voltage signals, referred to as ideal high and low reference voltage signals ($V_{refhi}$ and $V_{refli}$), respectively. The VCO 106 generates ideal high and low reference frequency signals ($f_{refhi}$ and $f_{refli}$) corresponding to the ideal high and low reference voltage signals ($V_{refhi}$ and $V_{refli}$), respectively. The compensation circuit 110 stores the ideal high and low reference frequency signals ($f_{refhi}$ and $f_{refli}$).

In a second phase of operation, the ADC 108 is enabled and performs the analog-to-digital conversion. The first input terminal of the ADC 108 receives a dummy analog signal from the ATE 104 and generates a corresponding dummy digital signal. As the ADC 108 is now enabled, first and second currents flow by way of the second and third pogo pins 112b and 112c, respectively, to the second and third input terminals of the ADC 108, respectively. First and second potential drops are developed across the second and third pogo pins 112b and 112c, respectively. The first and second potential drops alter the ideal high and low reference voltage signals ($V_{refhi}$ and $V_{refli}$), respectively. The altered high and low reference voltage signals are referred to as actual high and low reference voltage signals ($V_{refha}$ and $V_{refla}$). The VCO 106 generates actual high and low reference frequency signals ($f_{refha}$ and $f_{refla}$) corresponding to the actual high and low reference voltage signals ($V_{refha}$ and $V_{refla}$), respectively. The compensation circuit 110 stores the actual high and low reference frequency signals ($f_{refha}$ and $f_{refla}$). The dummy digital signal is discarded. The compensation circuit 110 determines a difference between the ideal high and low reference voltage signals ($V_{refhi} - V_{refli}$) and a difference between the actual high and low reference voltage signals ($V_{refha} - V_{refla}$). The compensation circuit 110 generates a compensation factor signal corresponding to a compensation factor value based on the difference between the ideal high and low reference voltage signals ($V_{refhi} - V_{refli}$) and the difference between the actual high and low reference voltage signals ($V_{refha} - V_{refla}$) and stores the compensation factor value that is represented by the following formula:

$$\text{Compensation factor value} = (V_{refha} - V_{refla})/(V_{refhi} - V_{refli})$$

In a third phase of operation, the ADC 108 is configured to receive the analog signal and generates the corresponding digital signal based on the analog signal and the actual high and low reference voltage signals ($V_{refha}$ and $V_{refla}$). The digital signal generated is thus an erroneous digital signal, represented by the following formula:

$$\text{Digital signal} = (V_{in} * 2^N)/(V_{refha} - V_{refla}),$$

where N represents number of bits in the digital signal. However, the compensation circuit 110 compensates for an error in the erroneous digital signal to generate an error free digital signal. The compensation circuit 110 multiplies the compensation factor signal corresponding to the compensation factor value with the erroneous digital signal to obtain the error free digital signal, referred to as the compensated digital signal, which is represented by the following equation:

$$\text{Compensated digital signal} = (V_{in}*2^N)/(V_{refha}-V_{refla}) * (V_{refha}-V_{refla})/(V_{refhi}-V_{refli}) = (V_{in}2^N)/(V_{refhi}-V_{refli}),$$

where N represents the number of bits in the digital signal. The ATE 104 receives the compensated digital signal and calculates a total unadjusted error (TUE) based on the compensated digital signal to determine whether the ADC 108 functions within a specified TUE range. If the TUE is beyond the specified range of TUE, the IC 102 is rejected and if the TUE is within the range, the IC 102 is scribed as a good IC 102.

Figure 2:
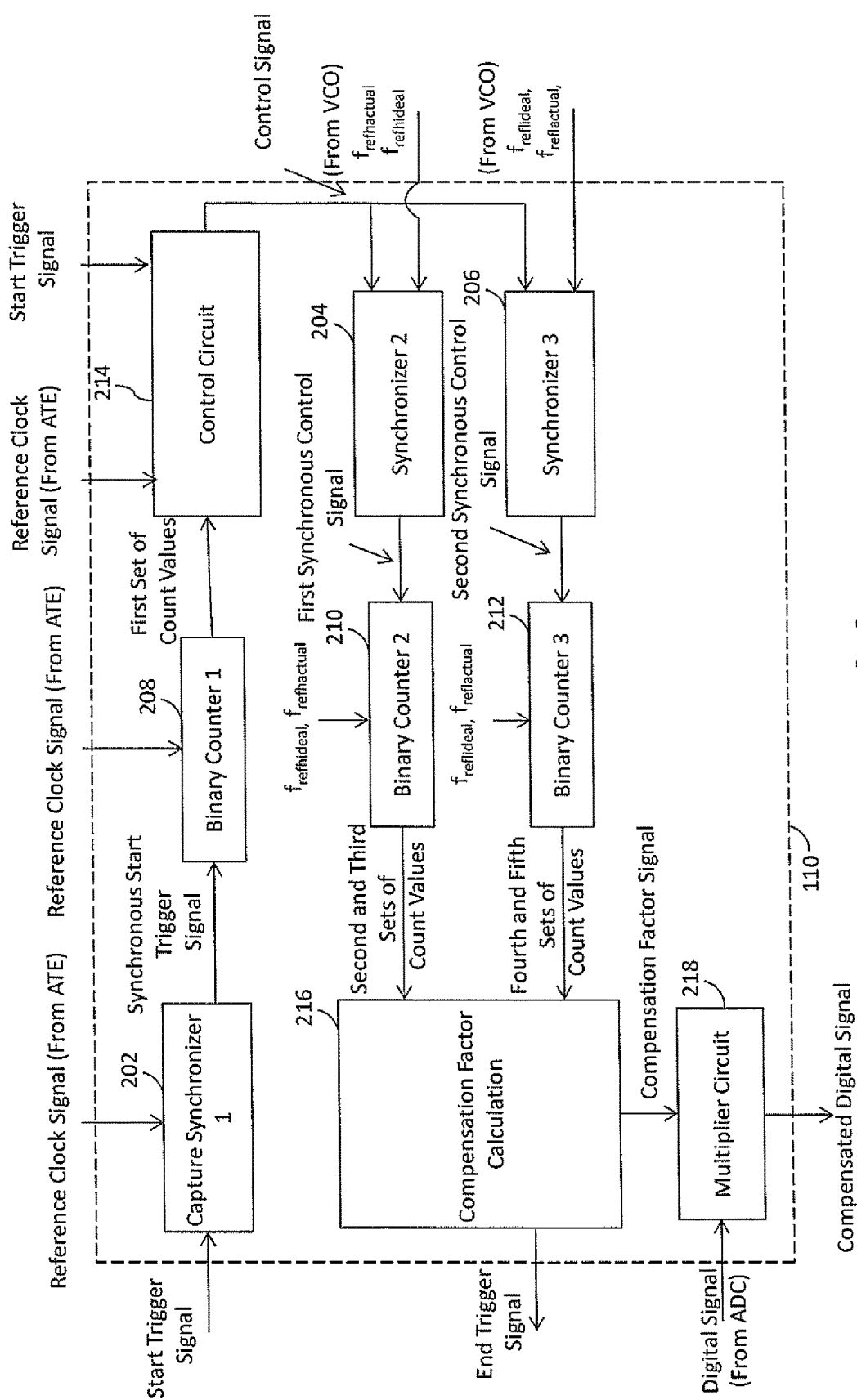
FIG. 2 is a schematic block diagram of a compensation circuit of the IC of FIG. 1, in accordance with an embodiment of the present invention.

Referring now to FIG. 2, a schematic block diagram of the compensation circuit 110 of FIG. 1, in accordance with the present invention, is shown. The compensation circuit 110 includes a capture synchronizer 202, first and second synchronizers 204 and 206, first through third binary counters 208-212, a control circuit 214, a compensation factor calculation circuit 216, and a multiplier circuit 218. A start trigger-signal from a processor (not shown) of the IC 102 enables the compensation circuit 110.

The capture synchronizer 202 has a clock input terminal connected to the ATE 104 for receiving the reference clock signal, an input trigger terminal connected to the processor for receiving the start trigger signal, and an output terminal for outputting a synchronous start trigger signal. The first binary counter 208 is an N-bit down counter and has an input terminal connected to the output terminal of the capture synchronizer 202 for receiving the synchronous start trigger signal and a clock input terminal for receiving the reference clock signal. The first binary counter 208 starts a count of a predetermined set of count values after the start trigger signal toggles between logic high and low states. The predetermined set of count values corresponds to a predetermined time period. A first set of N-bit count values is obtained at an output terminal of the first binary counter 208. The control circuit 214 has a first input terminal connected to the output terminal of the first binary counter 208 for receiving the first set of N-bit count values, second and third input terminals connected to the ATE 104 for receiving the reference clock and start trigger signals, respectively, and an output terminal for outputting a control signal for operating the second and third binary counters 210 and 212. It will be appreciated by skilled artisans that the first binary counter 208 may be replaced by an N-bit up counter.

The first and second synchronizers 204 and 206 each have an input terminal connected to the output terminal of the control circuit 214 for receiving the control signal. The first synchronizer 204 has a clock input terminal connected to the output terminal of the VCO 106 for receiving at least one of the ideal and actual high reference frequency signals ($f_{refhi}$ and $f_{refha}$) and an output terminal for outputting a first synchronous control signal. The second binary counter 210 is an N-bit up counter and has an input terminal connected to the output terminal of the first synchronizer 204 for receiving the first synchronous control signal and a clock input terminal connected to the output terminal of the VCO 106 for receiving at least one of the ideal and actual high reference frequency signals ($f_{refhi}$ and $f_{refha}$). The second binary counter 210 starts counting after the control signal toggles from logic low to logic high state and stops counting after the control signal toggles from logic high to logic low state. Second and third sets of N-bit count values are obtained at the output terminal of the second binary counter 210 corresponding to the ideal and actual high reference frequency signals ($f_{refhi}$ and $f_{refha}$), respectively.

The second synchronizer 206 has a clock input terminal connected to the output terminal of the VCO 106 for receiving at least one of the ideal and actual low reference frequency signals ($f_{refli}$ and $f_{refla}$)) and an output terminal for outputting a second synchronous control signal. The third binary counter 212 is an N-bit up counter and has an input terminal connected to the output terminal of the second synchronizer 206 for receiving the second synchronous control signal and a clock input terminal connected to the output terminal of the VCO 106 for receiving at least one of the ideal and actual low reference frequency signals ($f_{refli}$ and $f_{refla}$). The third binary counter 212 starts counting after the control signal toggles from logic low to high state and stops counting after the control signal toggles from logic high to low state. Fourth and fifth sets of N-bit count values are obtained at the output terminal of the third binary counter 212 corresponding to the ideal and actual low reference frequency signals ($f_{refli}$ and $f_{refla}$), respectively. The compensation factor calculation circuit 216 has first and second input terminals connected to the second and third binary counters 210 and 212, respectively, for receiving the second and third, and the fourth and fifth sets of N-bit count values, respectively, a first output terminal for outputting a compensation factor signal corresponding to the compensation factor value, and a second output terminal for outputting an end trigger signal. The multiplier circuit 218 has an input terminal connected to the first output terminal of the compensation factor calculation circuit 216 for receiving the compensation factor signal corresponding to the compensation value and an output terminal for outputting the compensated digital signal. The end trigger signal is provided to the processor of the IC 102 to indicate that the compensation factor signal corresponding to the compensation factor value is generated.

In operation, the processor provides the start trigger signal to the capture synchronizer 202 to initiate the generation of the compensation factor signal corresponding to the compensation factor value. When the start trigger signal toggles from logic low to logic high state, the control circuit 214 loads the predetermined set of count values into the first binary counter 208. The capture synchronizer 202 synchronizes the start trigger signal with the reference clock signal to generate the synchronous start trigger signal. The first binary counter 208 starts a count of the predetermined set of count values after the synchronous start trigger signal toggles from logic low to high state. The predetermined set of count values corresponds to the predetermined time period. In an embodiment of the present invention, the first binary counter 208 is a positive edge triggered counter. Thus, for every positive edge of the reference clock signal, the first binary counter 208 decrements the predetermined set of count values by a count value corresponding to binary one. The control circuit 214 receives the first set of N-bit count values and generates the control signal. The control signal toggles from logic low to high state when the first binary counter 208 starts the count of the predetermined set of count values and toggles from logic high to low state when the first binary counter 208 completes the count of the predetermined set of count values. The control circuit 214 now resets and reloads the first binary counter 208 with the predetermined set of count values and starts the count of the loaded predetermined set of count values again. Thus, for the manufacturing-test, the control circuit 214 operates the first binary counter 208 for four time intervals, each time interval corresponding to the predetermined time period. The first phase of operation of the manufacturing-test corresponds to first and second time intervals and the second phase of operation of the manufacturing-test corresponds to third and fourth time intervals.

During the first time interval, the ADC 108 is disabled. The first synchronizer 204 receives the ideal high reference frequency signal ($f_{refhi}$) and the control signal, and generates the first synchronous control signal. The first synchronous control signal is the control signal synchronized with the ideal high reference frequency signal ($f_{refhi}$). When the control signal toggles from logic low to high state, the first synchronous control signal loads the second binary counter 210 with a count value corresponding to binary zero and starts the second binary counter 210. The second binary counter 210 receives the ideal high reference frequency signal ($f_{refhi}$). In an embodiment of the present invention, the second binary counter 210 is a positive edge triggered counter and at every positive edge of the ideal high reference frequency signal ($f_{refhi}$), the second binary counter 210 increments the count value by a count value corresponding to binary one. Thus, the second binary counter 210 counts the positive edges of the ideal high reference frequency signal ($f_{refhi}$). When the control signal toggles from logic high to low state, the second binary counter 210 stops counting and the second set of N-bit count values is stored in the compensation factor calculation circuit 216.

During the second time interval, the ADC 108 continues to stay disabled. The second synchronizer 206 receives the ideal low reference frequency signal ($f_{refli}$) and the control signal, and generates the second synchronous control signal. The second synchronous control signal is the control signal synchronized with the ideal low reference frequency signal ($f_{refli}$). When the control signal toggles from logic low to high state, the second synchronous control signal loads the third binary counter 212 with a count value corresponding to binary zero and starts the third binary counter 212. The third binary counter 212 receives the ideal low reference frequency signal ($f_{refli}$). In an embodiment of the present invention, the third binary counter 212 is a positive edge triggered counter and at every positive edge of the ideal low reference frequency signal ($f_{refli}$) the third binary counter 212 increments the count value by a count value corresponding to binary one. Thus, the second binary counter 210 counts the positive edges of the ideal low reference frequency signal ($f_{refli}$). When the control signal toggles from logic high to low state, the third binary counter 212 stops counting and the fourth set of N-bit count values is stored in the compensation factor calculation circuit 216.

The aforementioned process is repeated in the subsequent third and fourth time intervals for the actual high and low reference frequency signals ($f_{refha}$ and $f_{refla}$). During the third and fourth time intervals, the ADC 108 is enabled and hence, the ADC 108 receives the actual high and low reference frequency signals ($f_{refha}$ and $f_{refla}$). The third and fifth sets of N-bit count values corresponding to the actual high and actual low reference frequency signals ($f_{refha}$ and $f_{refla}$), respectively, generated by the second and third binary counters 210 and 212, respectively, are stored in the compensation factor calculation circuit 216. The compensation factor calculation circuit 216 determines that the actual high and low reference frequency signals are different from the ideal high and low reference frequency signals based on the second, third, fourth, and fifth sets of N-bit count values. The compensation factor calculation circuit 216 determines that a voltage level of the actual high reference voltage signal is less than a voltage level of the ideal high reference voltage signal and a voltage level of the actual low reference voltage signal is greater than a voltage level of the ideal low reference voltage signal. Thus, the compensation factor calculation circuit 216 generates the compensation factor signal corresponding to the compensation factor value based on the second, third, fourth, and fifth sets of N-bit count values. On calculating the compensation factor value, the compensation factor calculation circuit 216 generates the end trigger signal at the second output terminal thereof and indicates to the processor that the compensation factor value has been calculated. It will be appreciated by those of skill in the art that an accuracy of the compensation factor value depends on depths of the first, second and third binary counters 208, 210, and 212 and a frequency at which the VCO 106 operates. The depth of the first binary counter 208 may be different from that of the second and third binary counters 210 and 212.

On receipt of the end trigger signal, the processor provides the analog signal to the ADC 108. The ADC 108 generates the erroneous digital signal. The compensation circuit 110 compensates for an error in the erroneous digital signal by way of the multiplier circuit 218. The multiplier circuit 218 multiplies the erroneous digital signal and the compensation factor signal corresponding to the compensation factor value and generates the compensated digital signal. Thus, the error introduced in the digital signal by the first and second potential drops across the second and third pogo pins 112b and 112c, respectively, is compensated for by the compensation circuit 110.

Figure 3A:
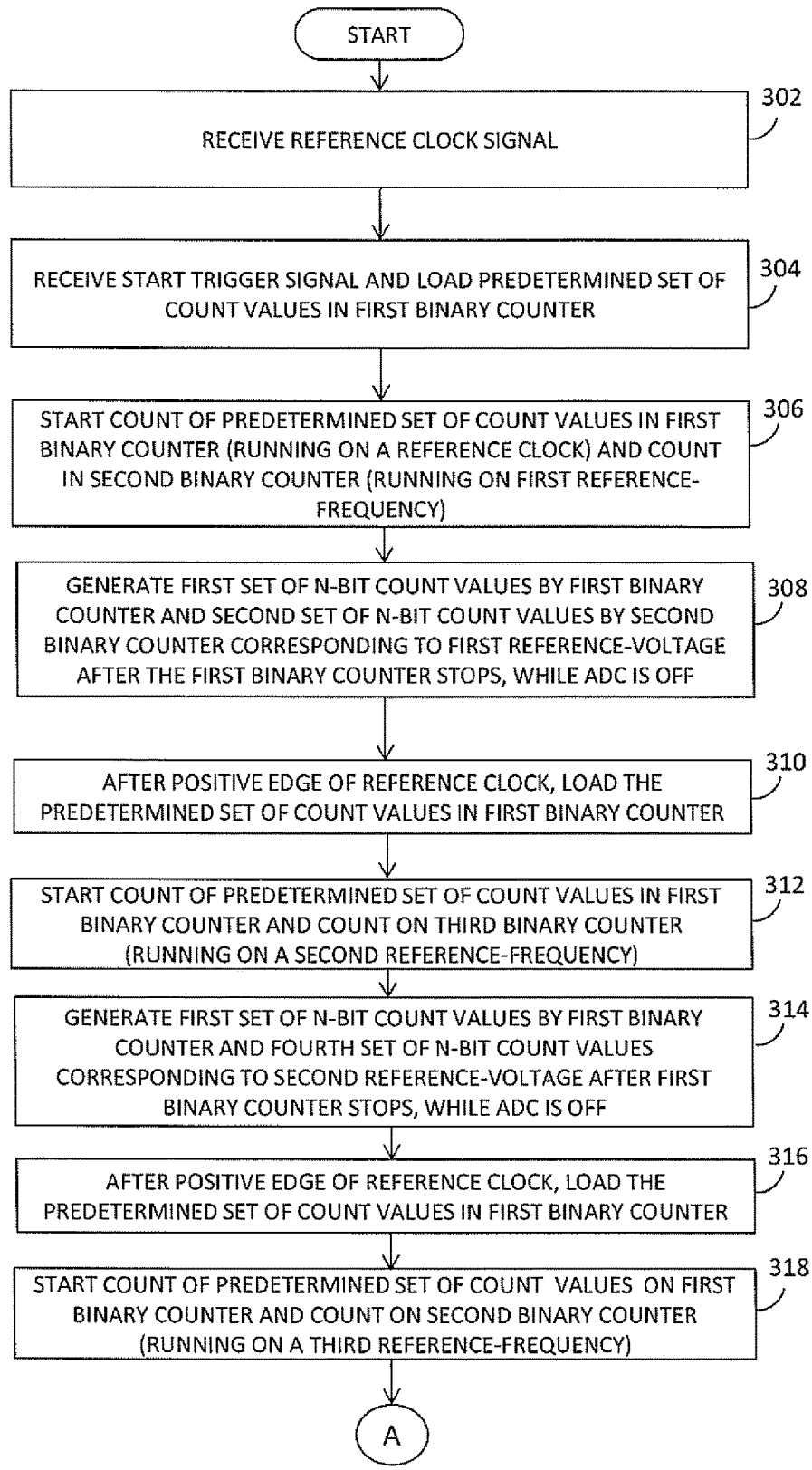
FIGS. 3A and 3B are a flow chart illustrating a method of operating first, second, and third binary counters with a control circuit of the compensation circuit of FIG. 2, in accordance with an embodiment of the present invention.
Figure 3B:
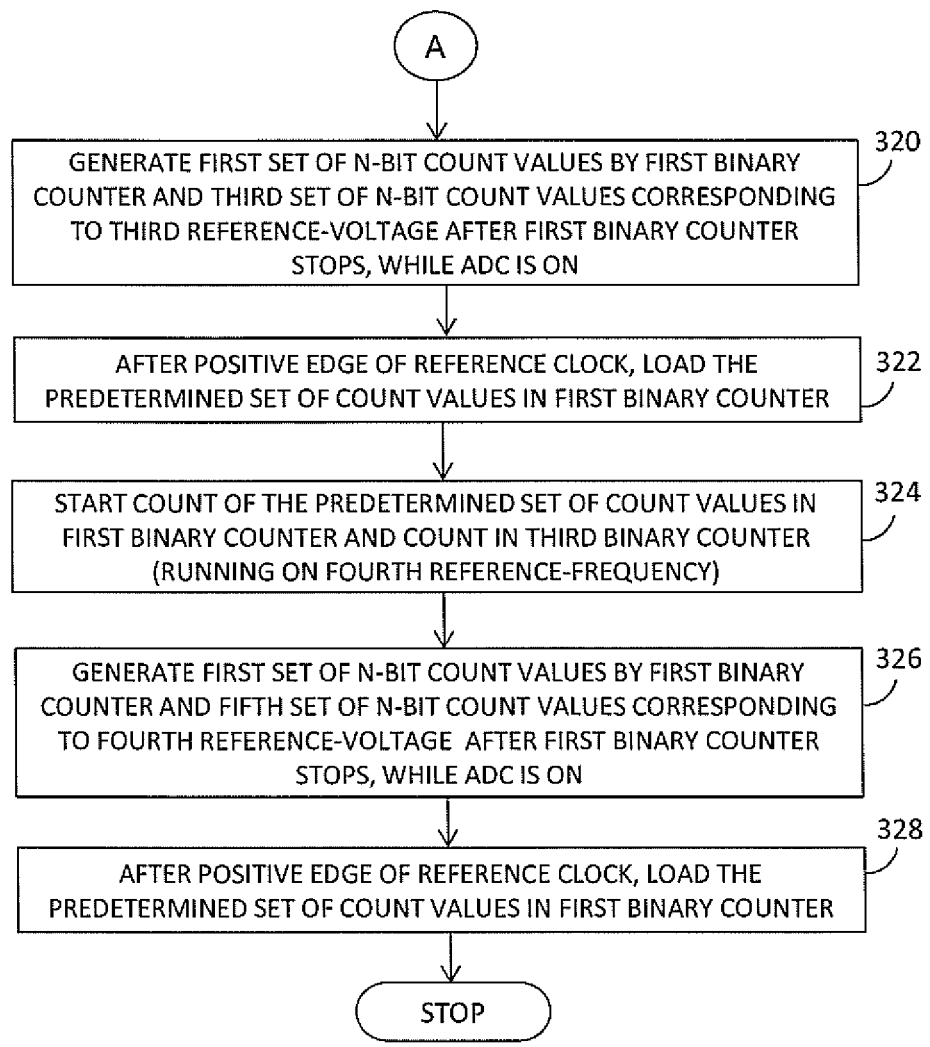

Referring now to FIGS. 3A and 3B, a flowchart illustrating a method of operating the first, second, and third binary counters 208, 210, and 212 by the control circuit 214 of the compensation circuit 110, in accordance with an embodiment of the present invention, is shown. At step 302, the control circuit 214 receives the reference clock signal and is in a default state of operation. At step 304, the control circuit 214 receives the start trigger signal and loads the predetermined set of count values in the first binary counter 208. At step 306, the first binary counter 208 starts a count of the predetermined set of count values and the second binary counter 210 starts a count from a count value corresponding to binary zero. At step 308, the first binary counter 208 generates the first set of N-bit count values and the second binary counter 210 generates the second set of N-bit count values that corresponds to a first reference voltage signal ($V_{refhi}$) when the first binary counter 208 completes the count of the predetermined set of count values while the ADC 108 is disabled. The control circuit 214 is said to be in a first state of operation. At step 310, after a positive edge of the reference clock signal, the control circuit 214 loads the predetermined set of count values in the first binary counter 208. At step 312, the first binary counter 208 starts the count of the predetermined set of count values and the third binary counter 212 starts a count from a count value corresponding to binary zero. At step 314, the first binary counter 208 generates the first set of N-bit count values and the third binary counter 212 generates the fourth set of N-bit count values that corresponds to a second reference voltage signal ($V_{refli}$) when the first binary counter 208 completes the count of the predetermined set of count values while the ADC 108 is disabled. The control circuit 214 is said to be in a second state of operation. At step 316, after a positive edge of the reference clock signal, the control circuit 214 loads the predetermined set of count values in the first binary counter 208. At step 318, the first binary counter 208 starts a count of the predetermined set of count values and the second binary counter 210 starts a count from a count value corresponding to binary zero. At step 320, the first binary counter 208 generates the first set of N-bit count values and the second binary counter 210 generates the third set of N-bit count values that corresponds to a third reference voltage signal ($V_{refha}$) when the first binary counter 208 completes the count of the predetermined set of count values while the ADC 108 is enabled. The control circuit 214 is said to be in a third state of operation. At step 322, after a positive edge of the reference clock signal, the control circuit 214 loads the predetermined set of count values in the first binary counter 208. At step 324, the first binary counter 208 starts a count of the predetermined set of count values and the third binary counter starts a count from a count value corresponding to binary zero. At step 326, the first binary counter 208 generates the first set of N-bit count values and the third binary counter 212 generates the fifth set of N-bit count values that corresponds to a fourth reference voltage signal ($V_{refla}$) when the first binary counter 208 completes the count of the predetermined set of count values while the ADC 108 is enabled. The control circuit 214 is said to be in a fourth state of operation. At step 328, after a positive edge of the reference clock signal, the control circuit 214 loads the predetermined set of count values in the first binary counter 208. The control circuit is now again in the default state of operation.

Figure 4:
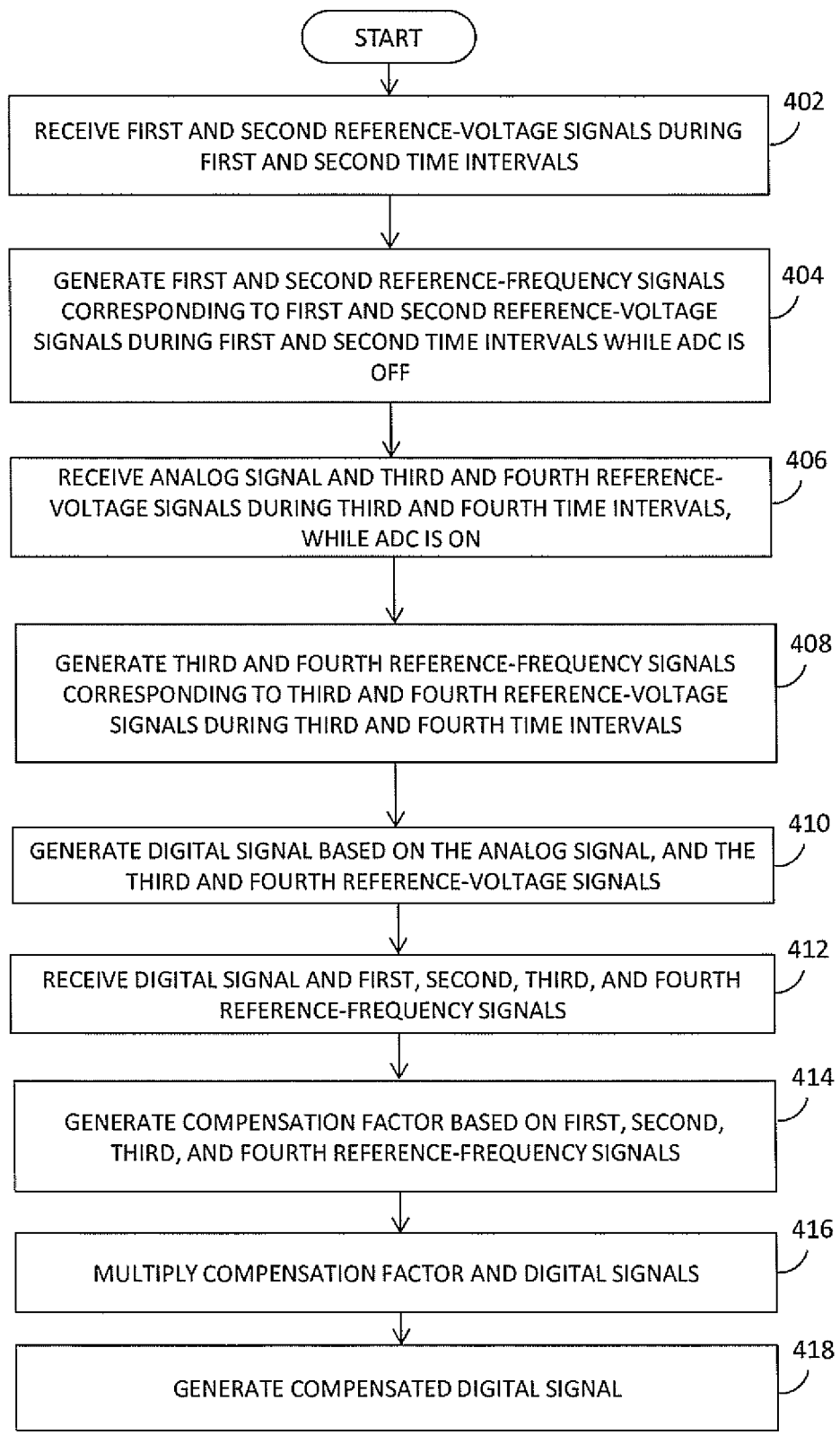
FIG. 4 is a flow chart illustrating a method of adjusting an erroneous digital signal output by an ADC of the IC of FIG. 1, in accordance with an embodiment of the present invention.

Referring now to FIG. 4, a flowchart illustrating a method of compensating the digital signal output by the ADC 108 of the IC 102 that is connected to the ATE 104, in accordance with an embodiment of the present invention, is shown. At step 402, the ADC 108 receives the first and second reference voltage signals (hereinafter referred to as ideal high and low reference voltage signals, $V_{refhi}$ and $V_{refli}$, respectively). At step 404, the VCO 106 generates the first and second reference frequency signals (hereinafter referred to as ideal high and low reference frequency signals, $f_{refhi}$ and $f_{refli}$, respectively) corresponding to the ideal high and low reference voltage signals, $V_{refhi}$ and $V_{refli}$, during the first and second time intervals while the ADC 108 is disabled. At step 406, the ADC 108 receives the analog signal and the third and fourth reference voltage signals (hereinafter referred to as actual high and low reference voltage signals, $V_{refha}$ and $V_{refla}$, respectively) during the third and fourth time intervals. At step 408, the VCO 106 generates the third and fourth reference frequency signals (hereinafter referred to as actual high and low reference frequency signals, $f_{refha}$ and $f_{refla}$, respectively) corresponding to the actual high and low reference voltage signals ($V_{refha}$ and $V_{refla}$) during the third and fourth time intervals while the ADC 108 is enabled. At step 410, the ADC 108 generates the digital signal based on the analog signal and the actual high and low reference voltage signals, $V_{refha}$ and $V_{refla}$. At step 412, the compensation circuit 110 receives the digital signal and the first, second, third, and fourth reference frequency signals ($f_{refhi}$, $f_{refli}$, $f_{refha}$, and $f_{refla}$). At step 414, the compensation circuit 110 generates the compensation factor signal based on the first, second, third, and fourth reference frequency signals ($f_{refhi}$, $f_{refli}$, $f_{refha}$, and $f_{refla}$. At step 416, the compensation circuit 110 multiplies the compensation factor and the digital signals. At step 418, the compensation circuit 110 generates the compensated digital signal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit connectable to an automated test equipment (ATE) by way of at least one pogo pin for testing the integrated circuit, the integrated circuit comprising:
   a voltage controlled oscillator (VCO) having an input terminal connected to the at least one pogo pin, for receiving first, second, third, and fourth reference voltage signals during first, second, third, and fourth time intervals, respectively, and an output terminal for outputting first, second, third, and fourth reference frequency signals corresponding to the first, second, third, and fourth reference voltage signals during the first, second, third, and fourth time intervals, respectively;
   an analog-to-digital converter (ADC) having a first input terminal for receiving an analog signal, a second input terminal connected to the at least one pogo pin for receiving the third reference voltage signal during the third time interval, a third input terminal connected to the at least one pogo pin for receiving the fourth reference voltage signal during the fourth time interval, and an output terminal for outputting a digital signal based on the analog signal and the third and fourth reference voltage signals; and
   a compensation circuit connected to the output terminals of the VCO and the ADC for generating a compensated digital signal based on the digital signal and the first, second, third, and fourth reference frequency signals.

2. The integrated circuit of claim 1, wherein the compensation circuit includes:
   a compensation factor calculation circuit connected to the output terminal of the VCO for receiving the first, second, third, and fourth reference frequency signals, and generating a compensation factor signal based on the first, second, third, and fourth reference frequency signals; and
   a multiplier circuit connected to the compensation factor calculation circuit for receiving the compensation factor signal and to the output terminal of the ADC for receiving the digital signal, for generating the compensated digital signal based on the compensation factor signal and the digital signal.

3. The integrated circuit of claim 2, wherein the multiplier circuit multiplies the compensation factor signal and the digital signal to generate the compensated digital signal.

4. The integrated circuit of claim 2, wherein the compensation factor signal corresponds to a ratio of a difference between voltage levels of the third and fourth reference voltage signals to a difference between voltage levels of the first and second reference voltage signals.

5. The integrated circuit of claim 4, wherein the digital signal is proportional to a ratio of a voltage level of the analog signal to the difference between the voltage levels of the third and fourth reference voltage signals, wherein the ratio of the voltage level of the analog signal to the difference between the voltage levels of the third and fourth reference voltage signals is multiplied by an Nth power of 2, where N is an integer.

6. The integrated circuit of claim 5, wherein the compensated digital signal is proportional to a ratio of the voltage level of the analog signal to the difference between the voltage levels of the first and second reference voltage signals, wherein the ratio of the voltage level of the analog signal to the difference between the voltage levels of the first and second reference voltage signals is multiplied by the Nth power of 2.

7. The integrated circuit of claim 1, wherein the first and second reference voltage signals are ideal high and low reference voltage signals, respectively, and the third and fourth reference voltage signals are erroneous high and low reference voltage signals, respectively.

8. An integrated circuit connectable to an automated test equipment (ATE) by way of at least one pogo pin for testing the integrated circuit, the integrated circuit comprising:
   a voltage controlled oscillator (VCO) having an input terminal connected to the at least one pogo pin, for receiving first, second, third, and fourth reference voltage signals during first, second, third, and fourth time intervals, respectively and an output terminal for outputting first, second, third, and fourth reference frequency signals corresponding to the first, second, third, and fourth reference voltage signals during the first, second, third, and fourth time intervals, respectively;
   an analog-to-digital converter (ADC) having a first input terminal for receiving an analog signal, a second input terminal connected to the at least one pogo pin for receiving the third reference voltage signal during the third time interval, a third input terminal connected to the at least one pogo pin for receiving the fourth reference voltage signal during the fourth time interval, and an output terminal for outputting a digital signal based on the analog signal and the third and fourth reference voltage signals; and
   a compensation circuit connected to the output terminals of the VCO and the ADC for generating a compensated digital signal based on the digital signal and the first, second, third, and fourth reference frequency signals, wherein the compensation circuit includes:
      a compensation factor calculation circuit for receiving the first, second, third, and fourth reference frequency signals during the first, second, third, and fourth time intervals, respectively, and generating a compensation factor signal; and
      a multiplier circuit connected to the compensation factor calculation circuit for receiving the compensation factor signal and to the output terminal of the ADC for receiving the digital signal, for generating a compensated digital signal based on the compensation factor and the digital signals.

9. The integrated circuit of claim 8, wherein the multiplier circuit multiplies the compensation factor and digital signals to generate the compensated digital signal.

10. The integrated circuit of claim 8, wherein the compensation factor signal corresponds to a ratio of a difference between voltage levels of the third and fourth reference voltage signals to a difference between voltage levels of the first and second reference voltage signals.

11. The integrated circuit of claim 10, wherein the digital signal is proportional to a ratio of a voltage level of the analog signal to the difference between the voltage levels of the third and fourth reference voltage signals, wherein the ratio of the voltage level of the analog signal to the difference between the voltage levels of the third and fourth reference voltage signals is multiplied by an Nth power of 2, where N is an integer.

12. The integrated circuit of claim 11, wherein the compensated digital signal is proportional to a ratio of the voltage level of the analog signal to the difference between the voltage levels of the first and second reference voltage signals, wherein the ratio of the voltage level of the analog signal to the difference between the voltage levels of the first and second reference voltage signals is multiplied by the Nth power of 2.

13. The integrated circuit of claim 8, wherein the first and second reference voltage signals are ideal high and low reference voltage signals, respectively, and the third and fourth reference voltage signals are erroneous high and low reference voltage signals, respectively.

14. A method of compensating a digital signal output by an analog-to-digital converter (ADC) of an integrated circuit that is connectable to an automated test equipment (ATE) by way of at least one pogo pin, wherein a voltage drop across the pogo pin causes an error in the digital signal, the method comprising:
generating first, second, third, and fourth reference frequency signals corresponding to first, second, third, and fourth reference voltage signals during first, second, third, and fourth time intervals, respectively;
generating a digital signal based on an analog signal, and the third and fourth reference voltage signals by the ADC; and
generating a compensated digital signal based on the digital signal and the first, second, third, and fourth reference frequency signals,
wherein the step of generating the compensated digital signal includes:
generating a compensation factor signal based on the first, second, third, and fourth reference frequency signals; and
multiplying the compensation factor and digital signals.

15. The method of claim 14, wherein the compensation factor signal corresponds to a ratio of a difference between voltage levels of the third and fourth reference voltage signals to a difference between voltage levels of the first and second reference voltage signals.

16. The method of claim 15, wherein the digital signal is proportional to a ratio of a voltage level of the analog signal to the difference between the voltage levels of the third and fourth reference voltage signals, wherein the ratio of the voltage level of the analog signal to the difference between the voltage levels of the third and fourth reference voltage signals is multiplied by an Nth power of 2, where N is an integer.

17. The method of claim 16, wherein the compensated digital signal is proportional to a ratio of the voltage level of the analog signal to the difference between the voltage levels of the first and second reference voltage signals, wherein the ratio of the voltage level of the analog signal to the difference between the voltage levels of the first and second reference voltage signals is multiplied by the Nth power of 2.

18. The method of claim 14, wherein the first and second reference voltage signals are ideal high and low reference voltage signals, respectively and the third and fourth reference voltage signals are erroneous high and low reference voltage signals, respectively.

* * * * *